United States Patent
Tan et al.

(10) Patent No.: US 7,589,657 B2
(45) Date of Patent: *Sep. 15, 2009

(54) ANALOG TO DIGITAL CONVERTER WITH INTERFERENCE REJECTION CAPABILITY

(75) Inventors: Seeteck Tan, Singapore (SG); Wenhuan Chen, Shanghai (CN)

(73) Assignee: O2Micro International Ltd., Georgetown (KY)

( * ) Notice: Subject to any disclaimer, the term of this patent is extended or adjusted under 35 U.S.C. 154(b) by 0 days.

This patent is subject to a terminal disclaimer.

(21) Appl. No.: 12/019,603

(22) Filed: Jan. 24, 2008

(65) Prior Publication Data
US 2008/0122674 A1   May 29, 2008

Related U.S. Application Data

(63) Continuation of application No. 11/486,964, filed on Jul. 14, 2006, now Pat. No. 7,324,037.

(51) Int. Cl.
*H03M 1/78* (2006.01)

(52) U.S. Cl. .................. 341/155; 341/164; 341/165; 341/166

(58) Field of Classification Search .............. 341/139, 341/155, 164, 165, 187; 455/232.1, 234.1
See application file for complete search history.

(56) References Cited

U.S. PATENT DOCUMENTS

| | | | | |
|---|---|---|---|---|
| 5,014,056 A | * | 5/1991 | Moriwaki | 341/161 |
| 5,963,586 A | * | 10/1999 | Durrant et al. | 375/142 |
| 6,331,832 B1 | * | 12/2001 | Rushing | 341/139 |
| 6,404,372 B1 | * | 6/2002 | Heithoff | 341/155 |
| 6,693,572 B1 | * | 2/2004 | Oliaei et al. | 341/143 |
| 7,324,037 B1 | * | 1/2008 | Tan et al. | 341/155 |
| 7,340,223 B1 | * | 3/2008 | Wright et al. | 455/91 |
| 7,479,910 B1 | * | 1/2009 | Heinks et al. | 341/143 |
| 2007/0058739 A1 | * | 3/2007 | Aytur et al. | 375/260 |
| 2008/0144707 A1 | * | 6/2008 | Tsfati et al. | 375/224 |

* cited by examiner

*Primary Examiner*—Linh V Nguyen
(74) *Attorney, Agent, or Firm*—Wang Law Firm, Inc.; Li K. Wang

(57) ABSTRACT

An analog to digital converter (ADC) with interference rejection capability and method thereof are disclosed. The ADC includes a threshold generator, a comparator circuit, a counter and an integrator. By comparing a signal with positive and negative threshold signals from the threshold generator, the comparator circuit converts the signal from analog to digital based on the result of the comparison. The counter counts a percentage of the digital signal and generates a bit signal based on the counted percentage. In response to the bit signal, the integrator supplies a control signal to the threshold generator to regulate the positive and negative threshold signals so as to maintain the counted percentage at a predetermined percentage threshold.

20 Claims, 14 Drawing Sheets

ANALOG TO DIGITAL CONVERTER WITH INTERFERENCE REJECTION CAPABILITY

RELATED APPLICATION

The present application is a continuation application of a U.S. patent application Ser. No. 11/486,964, filed on Jul. 14, 2006, which will be issued on Jan. 29, 2008 as U.S. Pat. No. 7,324,037.

FIELD OF THE INVENTION

The present invention relates to an analog to digital converter (ADC), and more particularly to an ADC with interference rejection capability.

BACKGROUND OF THE INVENTION

Currently, as wireless communication booms, signals in the radio interface tend to suffer from various interferences. Particularly, global positioning system (GPS) applications potentially will experience a mixture of both narrowband and wideband interferences. The nominal power of a signal at an antenna port of a GPS receiver is about −130 dBm, while the thermal noise level is about −110 dBm. Therefore, in normal operation, the received GPS signal is buried under the noise floor.

FIG. 1 is a block diagram of a prior art GPS receiver 100. Typically, a mixture of the GPS signal and the thermal noise is firstly converted to an intermediate frequency (IF) signal through a conventional RF filter, low noise amplifier and down-converting mixer. Then, after a complex filtering process, the IF signal is further amplified by a variable gain amplifier (VGA) 110 and converted from an analog format to a digital format by a 2-bit analog to digital converter (ADC) 120. The amplified IF signal should have a voltage level that satisfies the dynamic range requirement of the ADC 120. In order to control the voltage level of the amplified IF signal, an automatic gain control (AGC) loop 130 with a capacitor 140 is designed for regulating the gain of the VGA 110. The VGA 110, the ADC 120, the AGC loop 130 and the capacitor 140 form a signal amplification and digitization circuit.

FIG. 2 is a schematic diagram of the signal amplification and digitization circuit in FIG. 1. After being amplified by the VGA 110 according to a predetermined gain, the IF signal is then converted to a digital magnitude signal MGNA and to a digital sign signal SIGN by the 2-bit ADC 120. The 2-bit ADC 120 includes a current source 121 and a current sink 123. When the output from the VGA 110 is either larger than a positive reference signal Vref or smaller than a negative reference signal −Vref, the current sink 123 will sink a current Iout from the capacitor 140. Otherwise, the current source 121 will source the current Iout into the capacitor 140. At steady state condition, a DC voltage at the capacitor 140 is constant and fed back to the VGA 110. The feedback loop is usually called the AGC loop and used to regulate the predetermined gain. Generally, a time constant of the AGC loop has to be in the order of millisecond (ms), and therefore the capacitance of the capacitor 140 has to be in the order of nanofarads (nF). To have such a large capacitance, the capacitor 140 has to be realized off-chip as a discrete and external component and thus increases the overall cost of the circuitry.

After the aforementioned process, though the thermal noise still exists, a base-band correlator 150 in FIG. 1 can obtain a proper post-correlation signal-to-noise ratio (SNR) by correlating the digital signals MAGN and SIGN for a long period. However, for constant envelope continuous-wave (CW) interference, the SNR degradation is much greater than the thermal noise and the GPS receiver must reduce the SNR degradation prior to the correlation process. Interference is generally mitigated at the ADC 120. Furthermore, the CW interference has much larger power than the thermal noise, and therefore the AGC loop 130 should ensure that the gain of the VGA varies over a dynamic range in order to maintain an optimal signal amplitude at the input of the ADC 120.

It is thus desirous to have an ADC with interference rejection capability that is capable of implementing the aforementioned AGC loop directly so that a large external capacitor is not required. It is to such an ADC and AGC method thereof that the present invention is primarily directed.

SUMMARY OF THE INVENTION

In one embodiment, there is provided a receiver for acquiring a radio frequency (RF) signal. The receiver comprises an analog to digital converter (ADC) for digitalizing an intermediate frequency (IF) signal based upon said RF signal to a digital magnitude signal having a first and second state and generating a control signal based upon a counted percentage of said digital magnitude signal of being said first state.

In another embodiment, there is provided another receiver for acquiring a radio frequency (RF) signal that comprises an automatic gain control (AGC) circuit for implementing an automatic gain control in a digital form based upon said RF signal and generating a control signal based upon a counted percentage of a digital magnitude signal of being a state.

In yet another embodiment, there is provided a method for processing a radio frequency (RF) signal buried in interferences. The method comprises converting the RF signal to an intermediate frequency (IF) signal, amplifying the IF signal according to a predetermined gain of a variable gain amplifier (VGA), digitalizing said amplified IF signal to a digital magnitude signal having a first and second state, generating a control signal based upon a counted percentage of said digital magnitude signal of being said first state, and rejecting said interferences in said IF signal according to said control signal.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Figure 3:
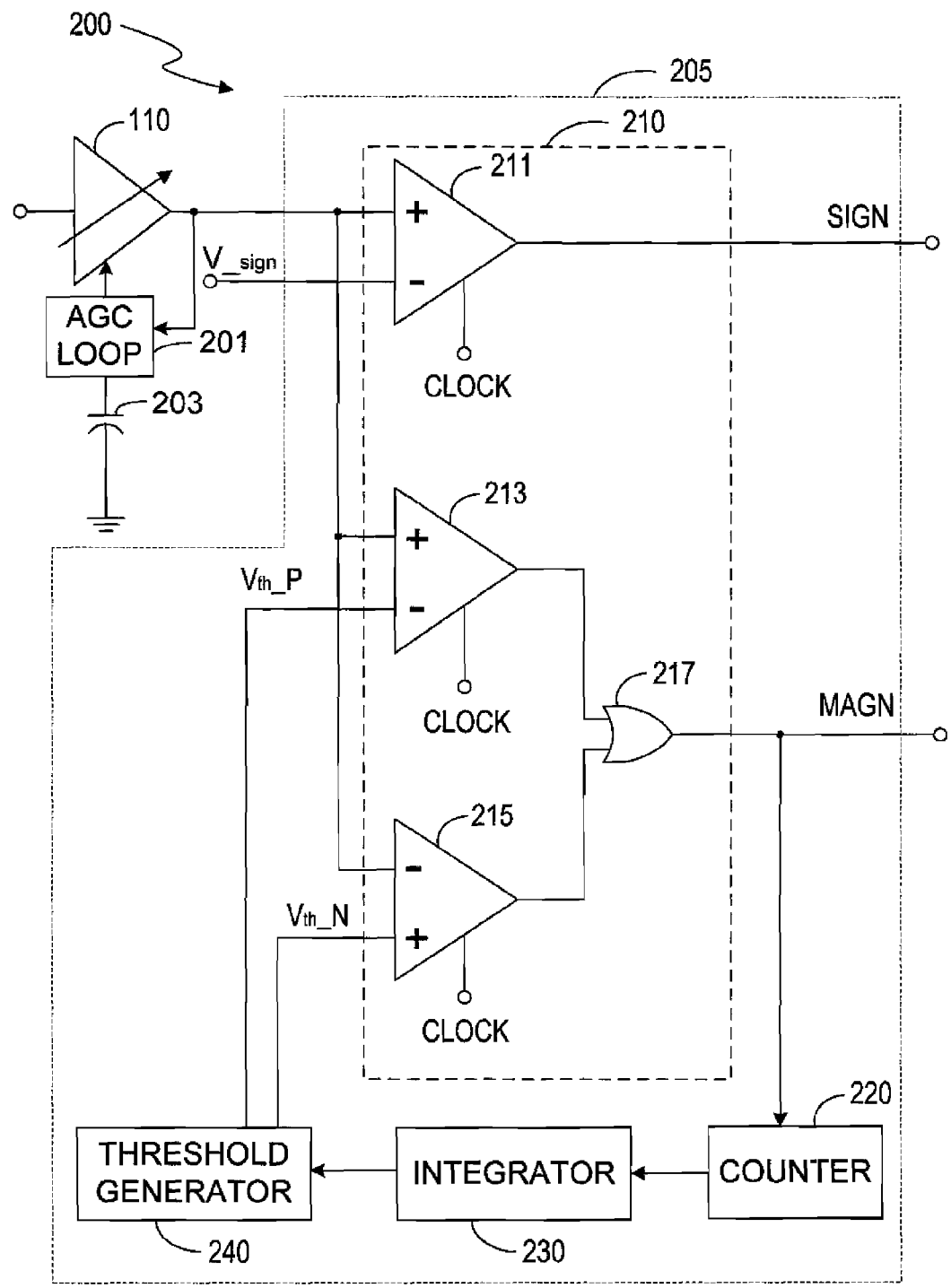
FIG. 3 is a block diagram of a signal amplification and digitization circuit according to one embodiment of the present invention.

FIG. 3 illustrates a block diagram of a signal amplification and digitization circuit 200. In the circuit 200, to maintain the output of the VGA 110 constant and optimal, an AGC loop 201 and a capacitor 203 are connected to the VGA 110. The VGA output is then converted from analog to digital by an ADC 205 with adaptive thresholds, which can reject the CW interference in the signal by adjusting the adaptive thresholds. The ADC 205 herein includes a comparator circuit 210, a counter 220, an integrator 230, and a threshold generator 240.

The VGA output that is mixed with the CW interference is firstly received by the comparator circuit 210. Meanwhile, a negative threshold signal Vth_N and a positive threshold signal Vth_P that are generated by the threshold generator 204 are sent to the comparator circuit 210. A constant sign threshold signal V_sign is also provided to the comparator circuit 210. The sign threshold signal V_sign indicates a sign threshold that is typically equal to 0V. The comparator circuit 210 includes comparators 211, 213, 215, and an OR gate 217. The comparator 211 compares the VGA output with the sign threshold signal V_sign to generate a digital sign signal SIGN. The comparator 213 and the comparator 215 compare the VGA output respectively with the positive threshold signal Vth_P and the negative threshold signal Vth_N, and then both of the comparison results are provided to the OR gate 217 to generate a digital magnitude signal MAGN. The comparators 211, 213, and 215 are also provided a clock signal for sampling the input signals.

The digital magnitude signal MAGN has two logic states, logic 1 and logic 0. The counter 220 counts the number of times when the digital magnitude MAGN is at the logic 1 within a predetermined period. The counting result is then compared with a percentage threshold signal in the counter 220 to generate a bit signal. The percentage threshold signal indicates a percentage threshold that has a predetermined value, for example, 33%. Typically, to ensure that the ADC 205 has optimal interference rejection capability, the percentage threshold should be 30% to 40%. In response to the bit signal, the integrator 230 provides a control signal to the threshold generator 240. Finally, the threshold generator 240 can regulate the negative and positive threshold signals Vth_N and Vth_P according to the control signal.

There are two time constants in the circuit 200. One is the time constant of the AGC loop 201, and the other is the time constant of the ADC 205. The presence of the two time constants can provide some flexibility for a system design.

Figure 4:
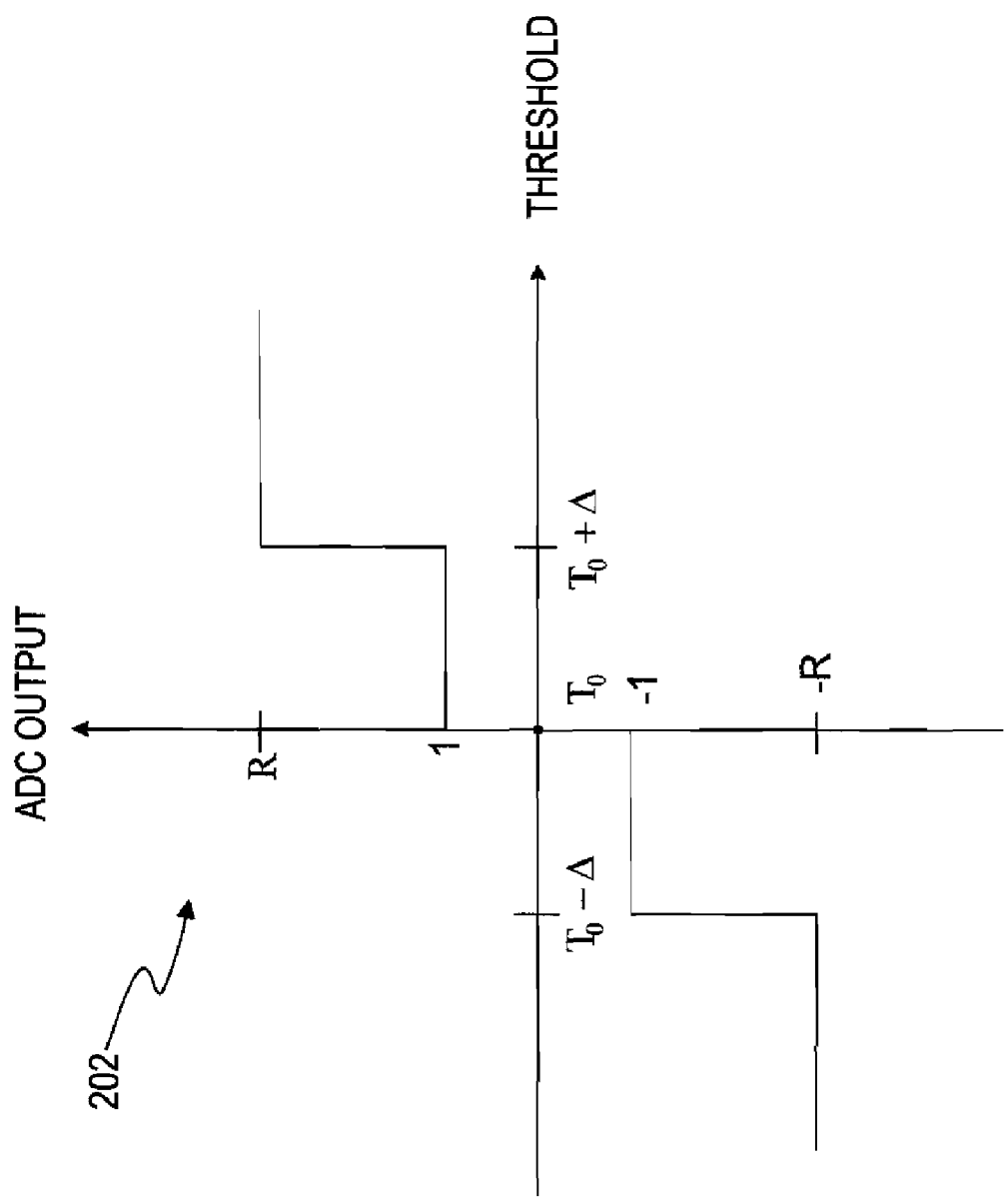
FIG. 4 is a plot illustrating a digitization strategy for the ADC illustrated in FIG. 3.

FIG. 4 is a plot 202 illustrating a digitization strategy of the ADC in FIG. 3. The sign threshold signal V_sign determines the sign threshold that is indicated on the horizontal coordinate as $T_0$, the positive and negative threshold signals Vth_P and Vth_N respectively determine an upper threshold and a lower threshold that are indicated on the horizontal coordinate as $T_0+\Delta$ and $T_0-\Delta$ respectively. It can be observed that the upper and lower thresholds are respectively higher and lower than the sign threshold by an equal absolute difference.

As shown in FIG. 4, there are four levels of ADC outputs, +R, +1, −1 and −R. When the signal sampled by the ADC 205 is higher than the upper threshold $T_0+\Delta$, the digital sign signal SIGN and the digital magnitude signal MIGN will be set to logic 1. In other words, samples exceeding the upper threshold are given weight R in the baseband correlator (not shown), which performs the correlation functions. Similarly, when samples are lower than the upper threshold $T_0+\Delta$ but higher than the sign threshold $T_0$, the digital sign signal SIGN and the digital magnitude signal MIGN will be set to logic 1 and logic 0 respectively and the samples are given weight +1 in the baseband correlator. When samples are lower than the sign threshold $T_0$ but higher than the lower threshold $T_0-\Delta$, the digital sign signal SIGN and the digital magnitude signal MIGN will be set to logic 0 and the samples are given weight −1 in the baseband correlator. When samples are lower than the lower threshold $T_0-\Delta$, the digital sign signal SIGN and the digital magnitude signal MIGN will be set to logic 0 and logic 1 respectively and the samples are given weight −R in the baseband correlator.

To gain an optimal interference rejection capability, all samples with magnitude covered by a voltage window defined by the upper and lower thresholds should be excluded from the baseband correlator. Only those samples with sufficient magnitude that exceeds the voltage window are passed to the baseband correlator. Typically, the passing percentage should be 30% to 40%. In other words, the percentage of the digital magnitude signal MAGN at logic 1 should be maintained at 30% to 40%.

Figure 5:
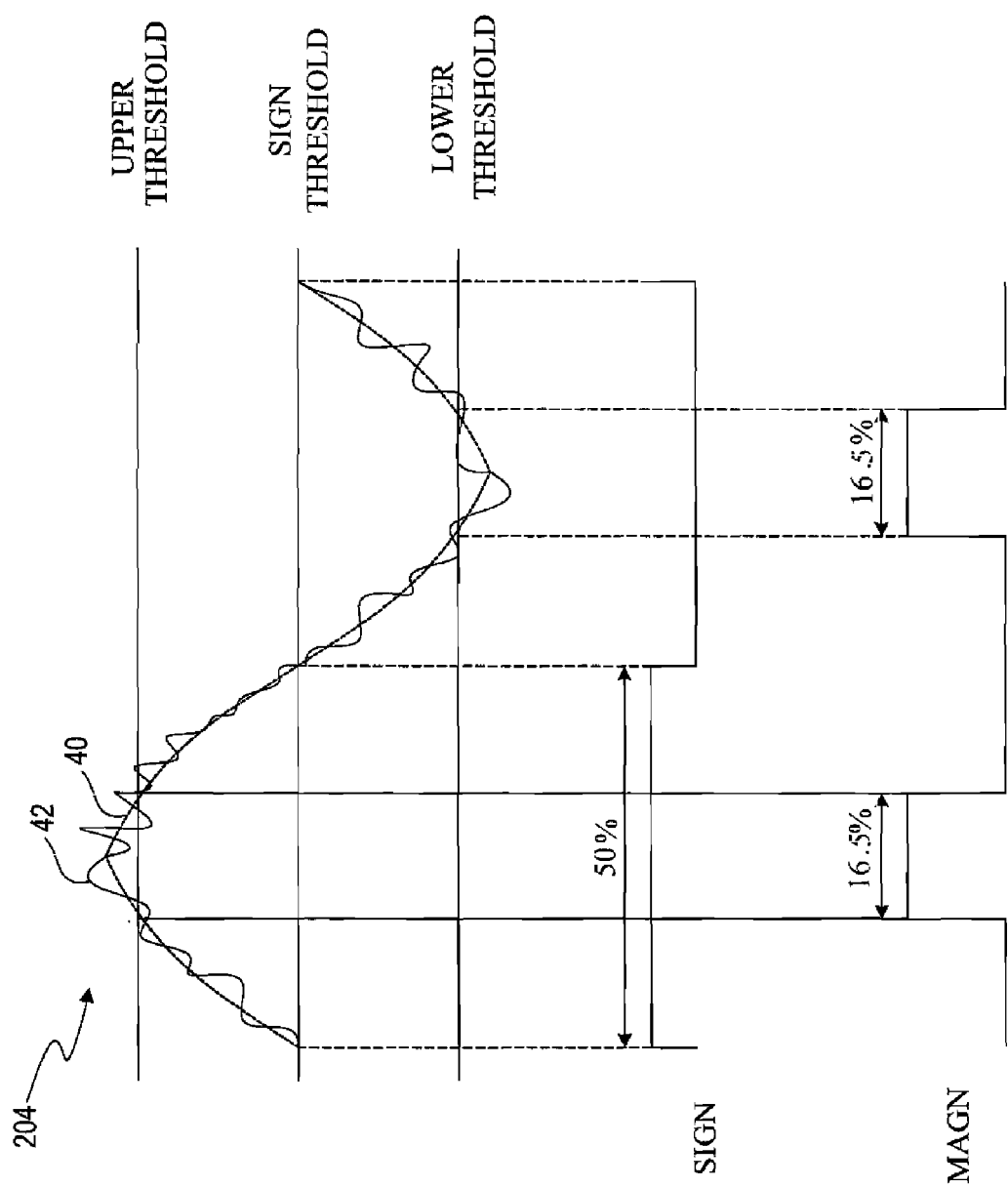
FIG. 5 is a diagram illustrating analog to digital signal conversion by the ADC illustrated in FIG. 3.

FIG. 5 is a diagram 204 illustrating analog to digital signal conversion by the ADC 205 in FIG. 3. As shown, the dashed curve 40 indicates the CW interference and the solid curve 42 indicates the signal mixture of the GPS signal, the thermal noise and the CW interference. In the embodiment, the objective of the ADC 205 is to maintain the percentage of the digital magnitude signal MAGN at logic 1 to 33%. To realize the objective, the ADC 205 is supplied with an adaptive voltage window defined by the upper and lower thresholds. The threshold generator 240 adjusts the voltage window by increasing the positive threshold signal Vth_P and decreasing the negative threshold signal Vth_N by the same magnitude when the control signal from the integrator 230 increments, or by decreasing the positive threshold signal Vth_P and increasing the negative threshold signal vth_N by the same magnitude when the control signal decrements.

Figure 2:
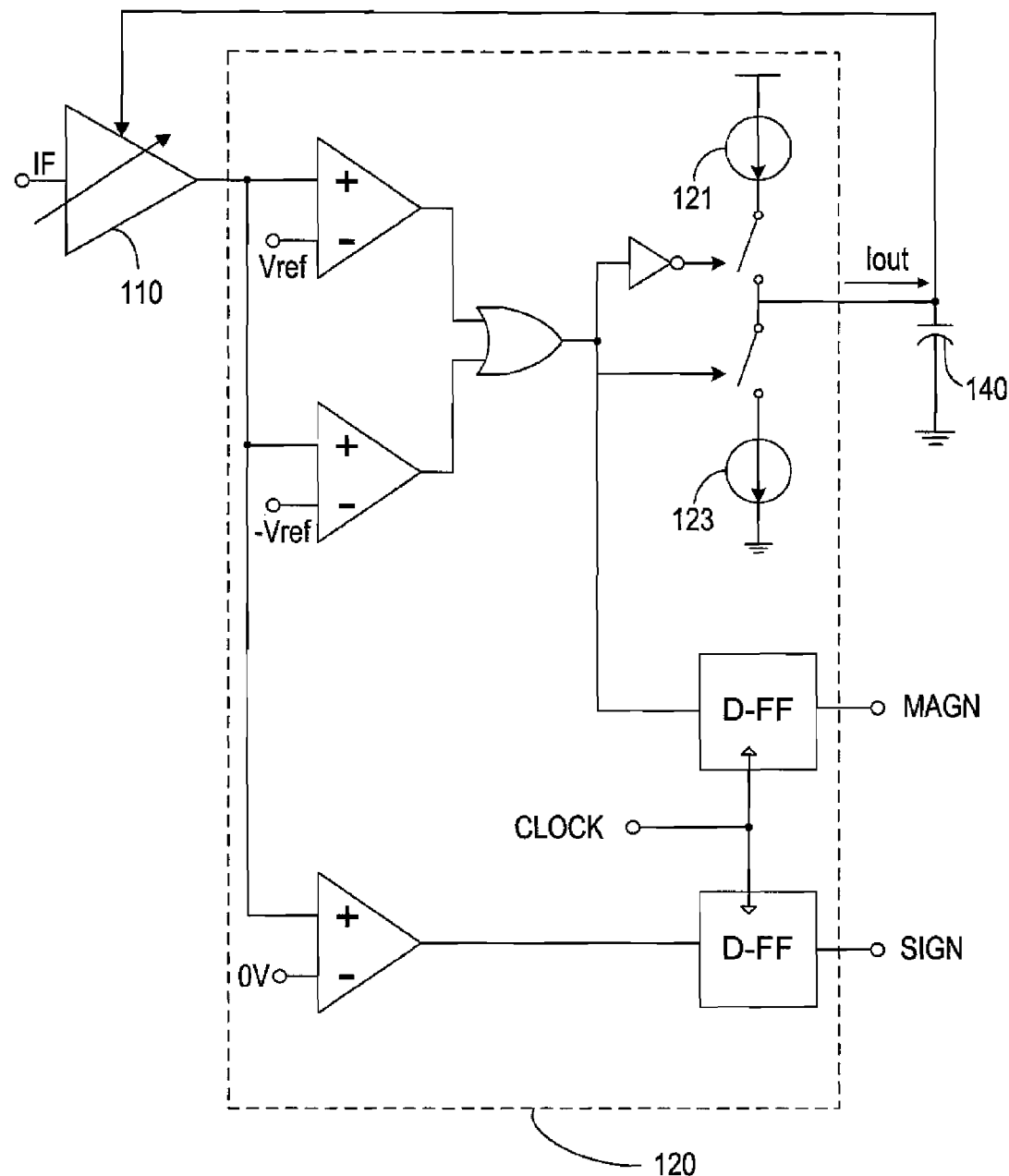
FIG. 2 is a schematic diagram of the ADC and the AGC loop illustrated in FIG. 1.
Figure 6:
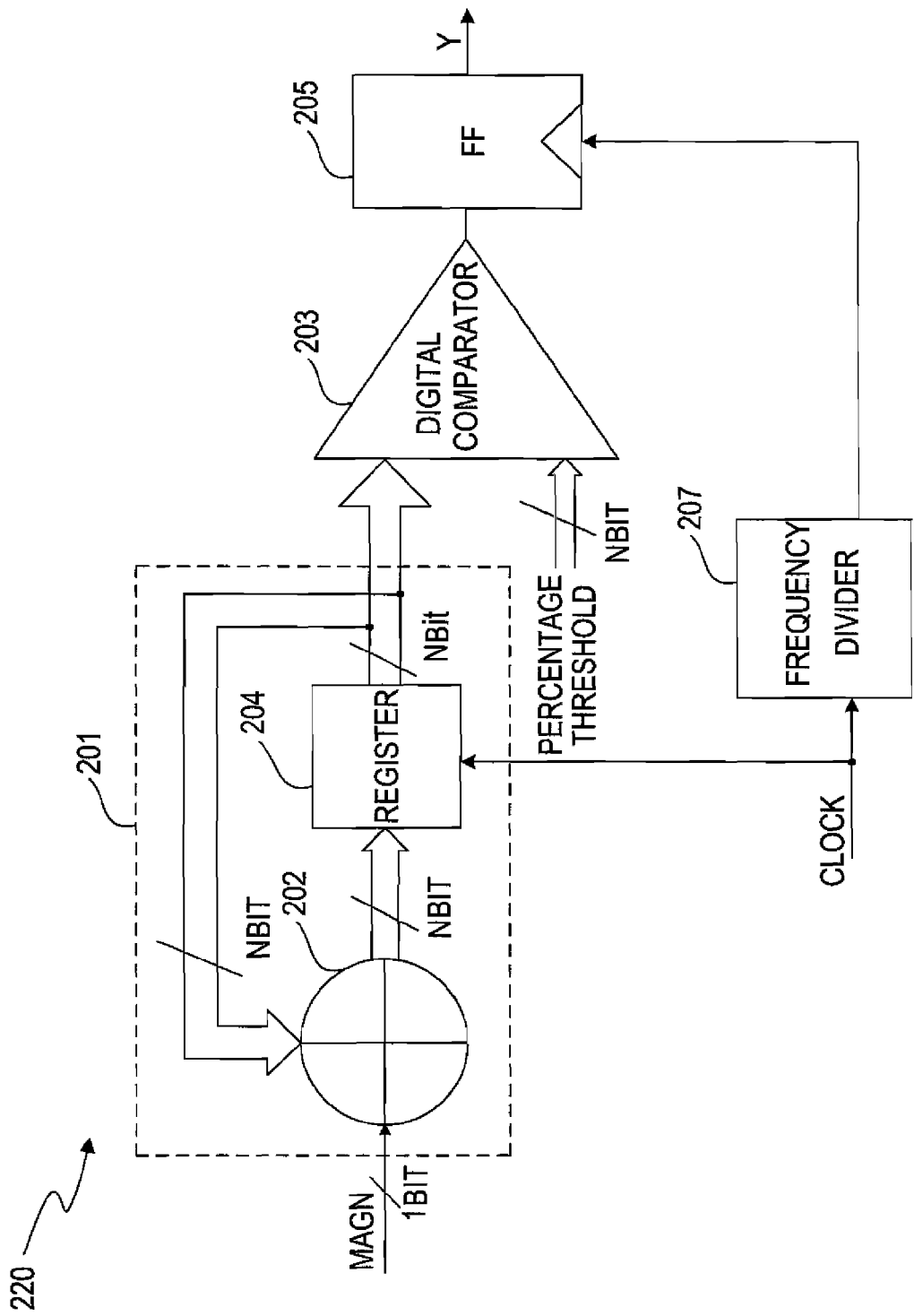
FIG. 6 is a schematic diagram of a counter according to one embodiment of the present invention.

FIG. 6 illustrates a schematic diagram of the counter 220 in FIG. 3. The counter 220 includes an N bit accumulator 201, a digital comparator 203, a flip-flop 205, and a frequency divider 207. The N bit accumulator 201 is composed of a digital adder 202 and a register 204. The N bit accumulator 201 is capable of counting the number of the digital magnitude signal MAGN that is set to logic 1. The counted value is outputted as an accumulation signal. The N bit accumulator 201 is also clocked by the same clock signal that is used for clocking the comparator circuit 210 in FIG. 2. If N is equal to 14 and the frequency of the clock signal is 16 MHz, then a counting cycle lasts 1.024 ms and the 14 bit accumulator 201 is able to count up to the maximum value of 16,384. Moreover, given the overall bit amount is fixed at 16,384 per counting cycle, the accumulation signal also indicates a counted percentage of the digital magnitude signal MAGN at logic 1. The accumulation signal is then provided to the digital comparator 203 to compare with the percentage threshold. If the targeted percentage of the digital magnitude MAGN at logic 1 within the counting cycle is 33%, then the percentage threshold should be set as 5406, which is 33% of the overall bit amount, 16,384. Finally, a comparison signal that indicates the comparison result is supplied from the digital comparator 203 to the flip-flop 205. Furthermore, since the comparison at the digital comparator 203 is performed once every 1.024 ms, the frequency divider 207 is adopted to divide the clock signal from 16 MHz to 976 KHz and supplies the divided clock signal to the flip-flop 205. According to the comparison signal, the flip-flop 205 generates the bit signal Y.

Figure 7:
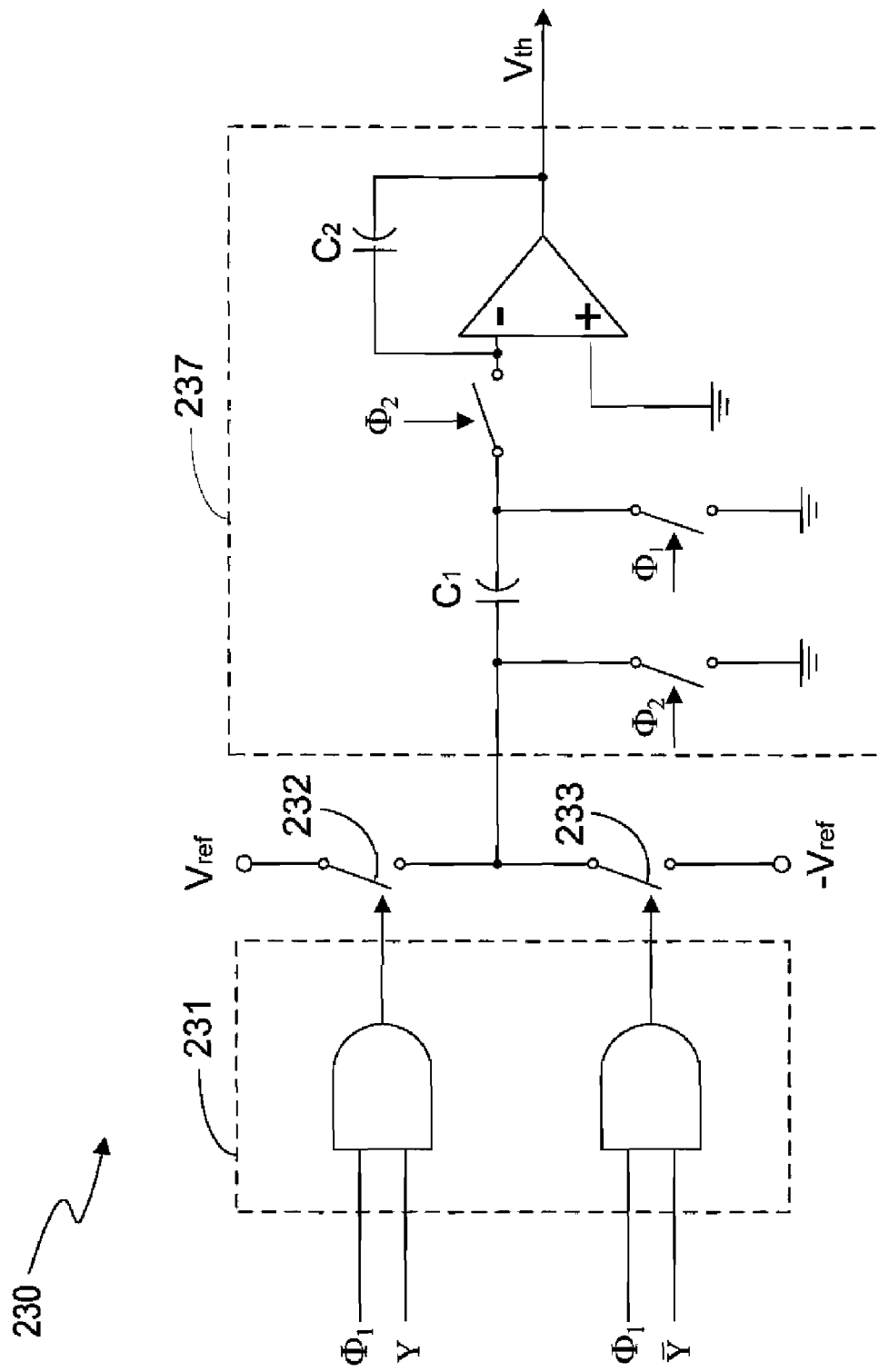
FIG. 7 is a schematic diagram of an integrator according to one embodiment of the present invention.

FIG. 7 illustrates a schematic diagram of the integrator 230 in FIG. 3. The integrator 230 includes a switch controller 231, switches 232 and 233, and a discrete-time integrator 237. In response to the bit signal Y and a pair of non-overlapping clocks $\Phi_1$ and $\Phi_2$, the integrator 237 generates a control signal Vth.

Figure 8:
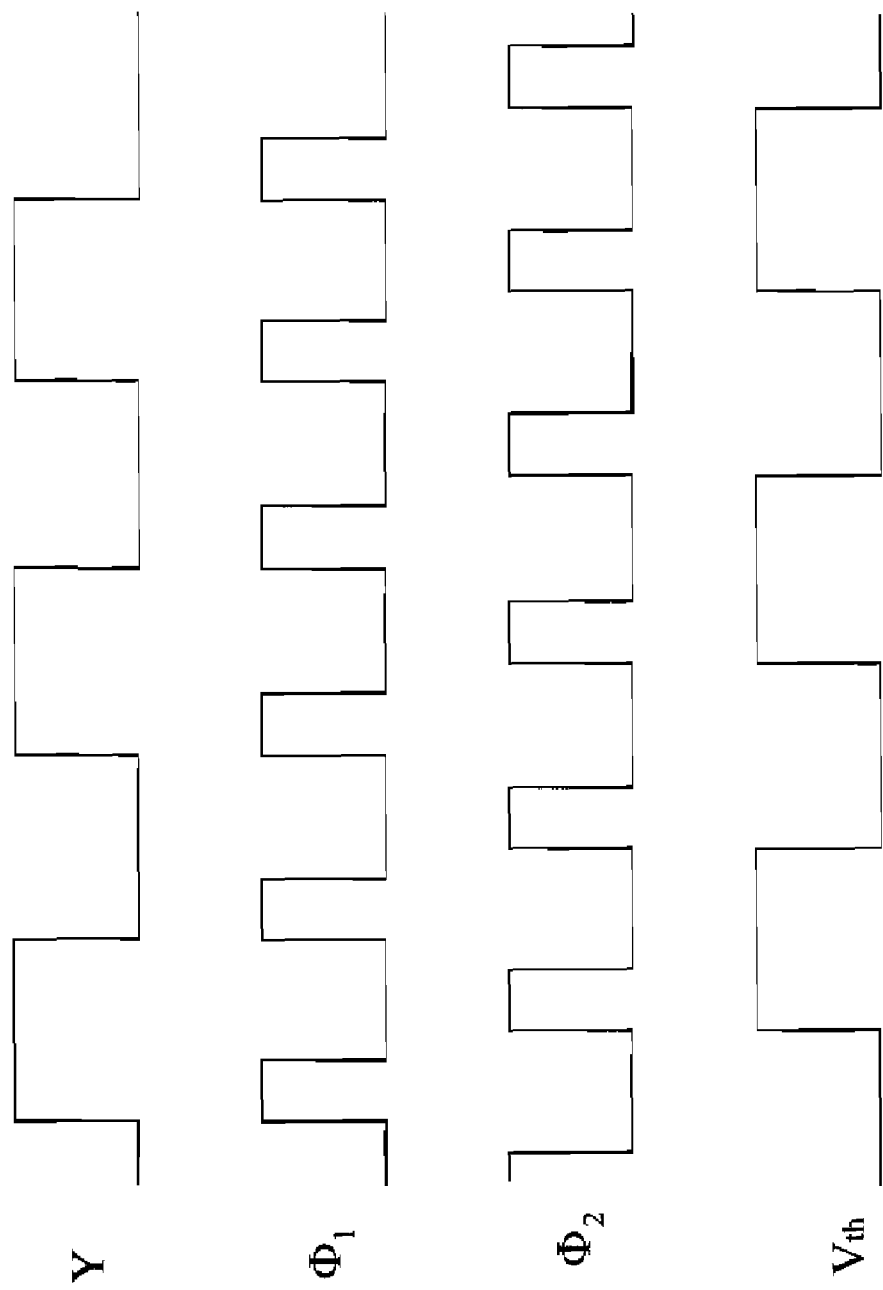
FIG. 8 is a timing diagram of the integrator illustrated in FIG. 7.

FIG. 8 illustrates a timing diagram of the integrator 230. Through conducting AND operation on the bit signal Y and the clock $\Phi_1$, and on the inverse of Y and the clock $\Phi_1$, respectively, the switch controller 231 generates a first switch control signal and a second switch control signal for turning the switches 232 and 233 on alternatively. When the switch 232 is turned on, a positive reference voltage Vref is supplied to the discrete-time integrator 237 through the switch 232. In light of the positive reference voltage Vref, the discrete-time integrator 237 sets a voltage level of the control signal Vth. When the second switch 233 is turned on, a negative reference voltage −Vref is supplied to the discrete-time integrator 237 through the second switch 233. In light of the negative reference voltage −Vref, the discrete-time integrator 237 sets the voltage level of the control signal Vth.

Figure 9:
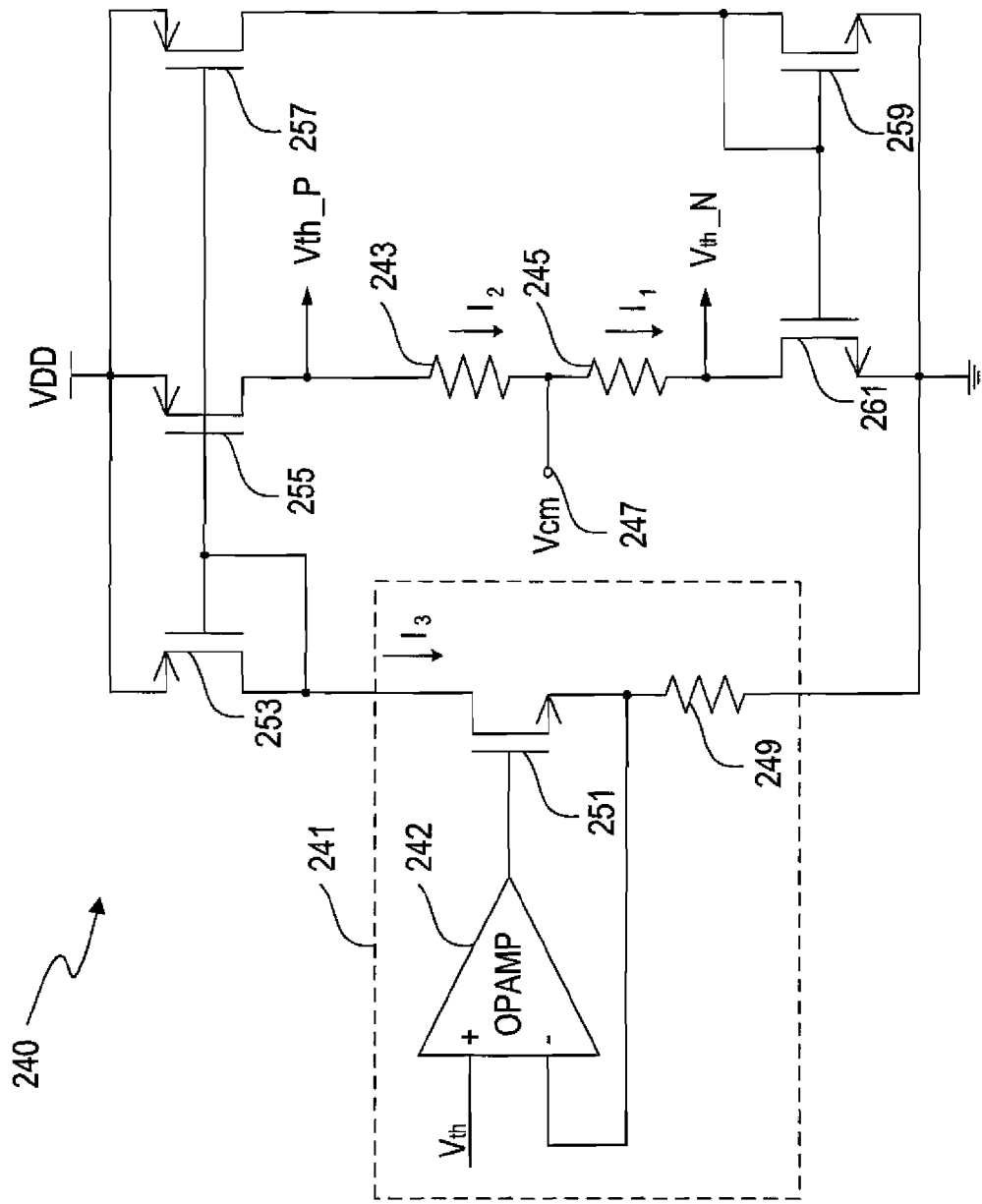
FIG. 9 is a schematic diagram of a threshold generator according to one embodiment of the present invention.

FIG. 9 illustrates a schematic diagram of the threshold generator 240 in FIG. 3. The threshold generator 240 includes a voltage to current converter 241, resistors 243 and 245, and a current mirror unit composed of transistors 253, 257, 259, and 261. The voltage to current converter 241 further includes a voltage follower formed by an operational amplifier 242 and a transistor 251. The voltage follower receives the control signal Vth and passes the voltage of the control signal to a resistor 249 placed between the voltage follower and the ground. A current $I_3$ that is equal to Vth/$R_3$ is generated and then flows through the transistor 253 that is placed between the voltage follower and power source VDD, wherein $R_3$ is defined as the resistance of the resistor 249. The current $I_3$ is then mirrored to the resistor 243 via a current mirror formed by the transistors 253 and 255 in the current mirror unit. The current $I_3$ is further mirrored to the resistor 245 via current mirrors formed by the transistors 253, 257, 259, and 261. When the mirrored current that is defined as $I_2$ flows through the resistor 243, the positive threshold signal Vth_P is obtained. When the mirrored current that is defined as $I_1$ flows through the resistor 245, the negative threshold signal Vth_N is obtained. Furthermore, juncture node of the resistors 243 and 245 is further coupled to a common terminal 247 through which a common mode voltage Vcm is received.

When the transistors in the current mirror unit match with each other, and a resistance $R_1$ of the resistor 243 is further equal to a resistance $R_2$ of the resistor 245, an equation 1) below can be concluded.

$$V_{th\_P} - V_{cm} = I_1 R_1 = I_3 R_1 = V_{th} \frac{R_1}{R_3} = V_{th} \frac{R_2}{R_3} = I_3 R_2 = I_2 R_2 = V_{cm} - V_{th\_N} \quad 1)$$

Referring to the equation 1), when the control signal Vth increments, the positive and negative threshold signals Vth_P and Vth_N will respectively increase and decrease by the same magnitude, and when the control signal Vth decrements, the positive and negative threshold signals Vth_P and Vth_N will respectively decrease and increase by the same magnitude.

Figure 10:
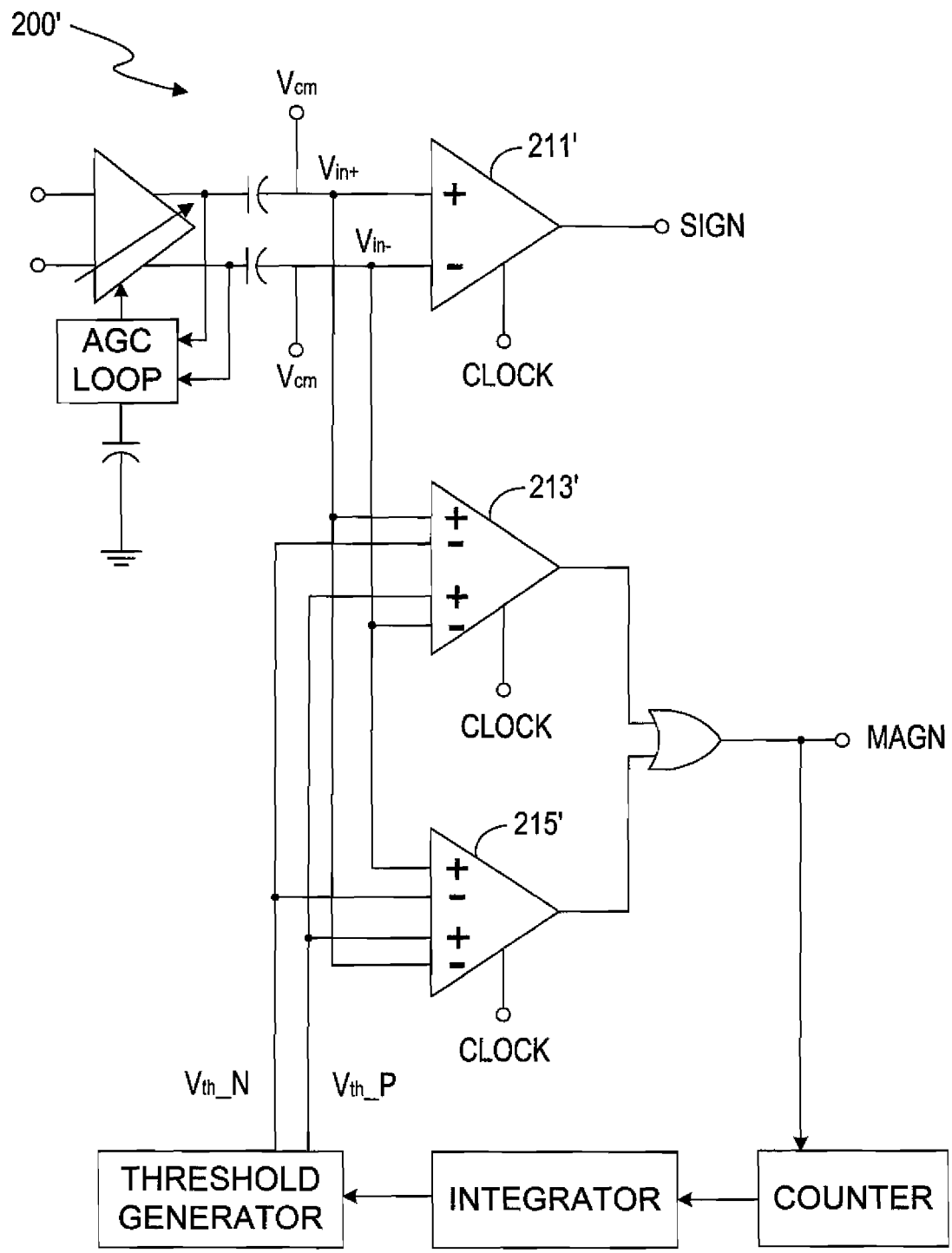
FIG. 10 is a block diagram of a signal amplification and digitization circuit according to another embodiment of the present invention.

FIG. 10 illustrates a block diagram of a signal amplification and digitization circuit 200'. In some environments, the IF signal has a form of differential inputs. Hence, the circuit 200' especially is designed for differential inputs. For the ADC of the circuit 200', differential inputs Vin+ and Vin− are connected respectively to the non-inverting and inverting terminals of the comparator 211' to generate the digital sign signal SIGN, the comparators 213 and 215 are replaced respectively by differential comparators 213' and 215'. Each of the differential comparators 213' and 215' includes a first differential input pair and a second differential input pair. Correspondingly, circuitries relevant to these differential comparators should be redesigned. To be specific, the input Vin+ and the negative threshold signal Vth_N are respectively provided to the non-inverting and inverting terminals of the first differential input pair of the differential comparator 213'. The input Vin− and the positive threshold signal Vth_P are respectively provided to the inverting and non-inverting terminals of the second differential input pair of the differential comparators 213'. The input Vin− and the negative threshold signal Vth_N are respectively provided to the non-inverting and inverting terminals of the first differential input pair of the differential comparator 215'. The input Vin+ and the positive threshold signal Vth_P are respectively provided to the inverting and non-inverting terminals of the second differential input pair of the differential comparators 215'.

Figure 11:
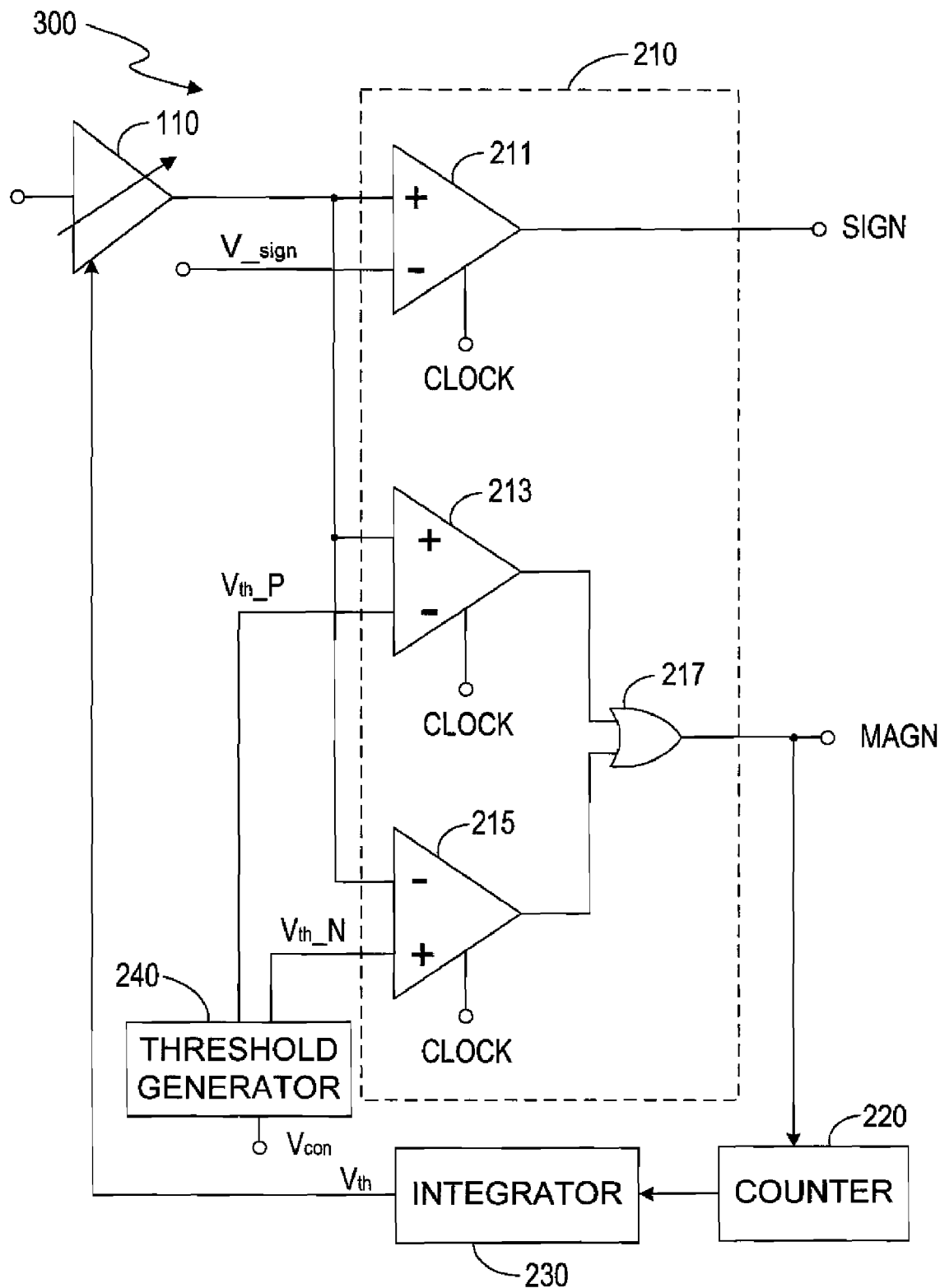
FIG. 11 is a block diagram of an ADC according to one embodiment of the present invention.

FIG. 11 illustrates a block diagram of an exemplary ADC 300 implementing automatic gain control and interference rejection simultaneously. The ADC 300 also includes the comparator circuit 210, the counter 220, the integrator 230, and the threshold generator 240. However, the control signal Vth from the integrator 230 is fed back to the VGA 110 directly and used to regulate the gain of the VGA 110.

To be specific, the gain is increased when the counted percentage of the digital magnitude signal MAGN at logic 1 is lower than the predetermined percentage threshold, for example 33%, and otherwise, the gain is decreased. It is appreciated by those skilled in the art that the integrator 230 herein has simple modification to ensure the AGC loop is negative. Furthermore, the threshold generator 240 receives a constant voltage signal Vcon and generates the positive and negative threshold signals Vth_P and Vth_N, which are also constant in this situation. Through implementing the automatic gain control by the ADC 300 directly, the percentage of the digital magnitude signal MAGN at logic 1 is eventually maintained at the percentage threshold and thus the CW interference is rejected and simultaneously the dynamic range requirement of the ADC 300 is satisfied.

Figure 1:
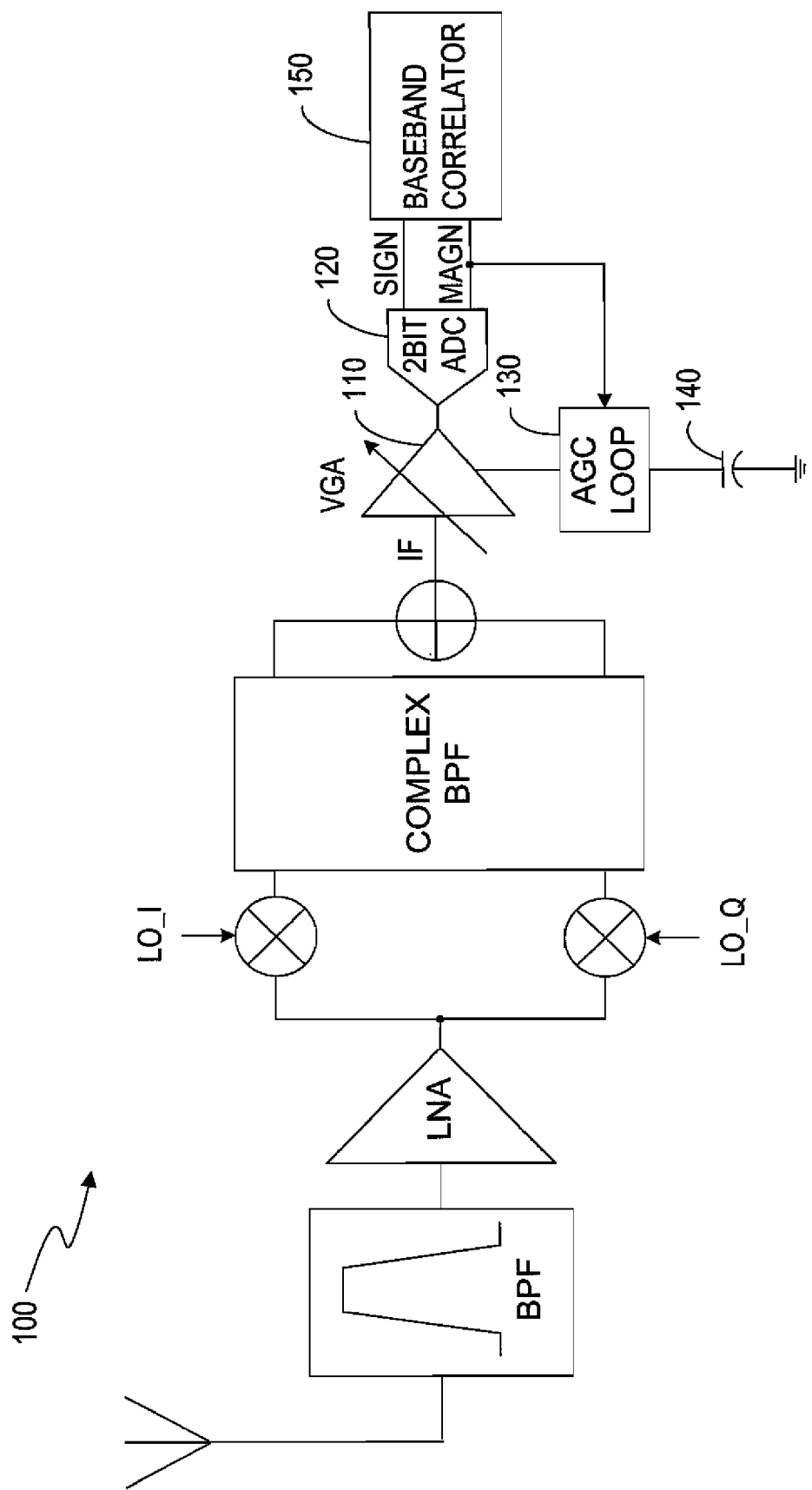
FIG. 1 is a block diagram of a prior art GPS receiver.
Figure 12:
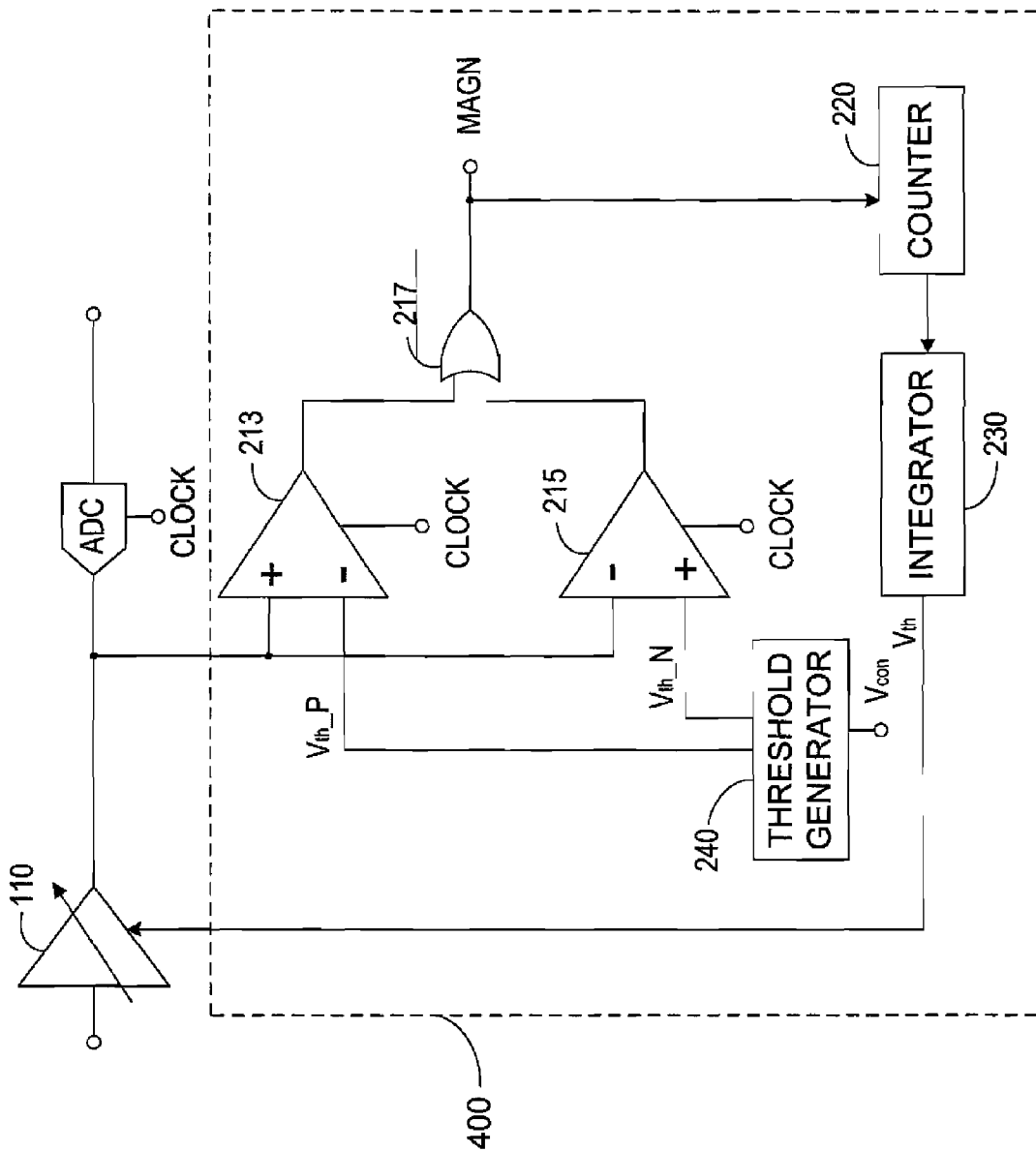
FIG. 12 is a block diagram of an automatic gain control circuit according to one embodiment of the present invention.

FIG. 12 illustrates a block diagram of an exemplary AGC circuit 400. The AGC circuit 400 implements the automatic gain control in a digital form so that the large external capacitor 140 in FIG. 1 is not required. The AGC circuit 400 may be used in conventional communication systems that utilize frequency or phase modulation, such as frequency shift key (FSK), phase shift key (PSK) and etc. In such conventional communication systems, the percentage threshold is set based on design consideration.

Regarding to a differential input signal, it is appreciated by those skills in the art that the block diagrams in FIGS. 11 and 12 can be modified with reference to the circuitry in FIG. 10. The detailed modification is omitted herein for clarity.

Figure 13:
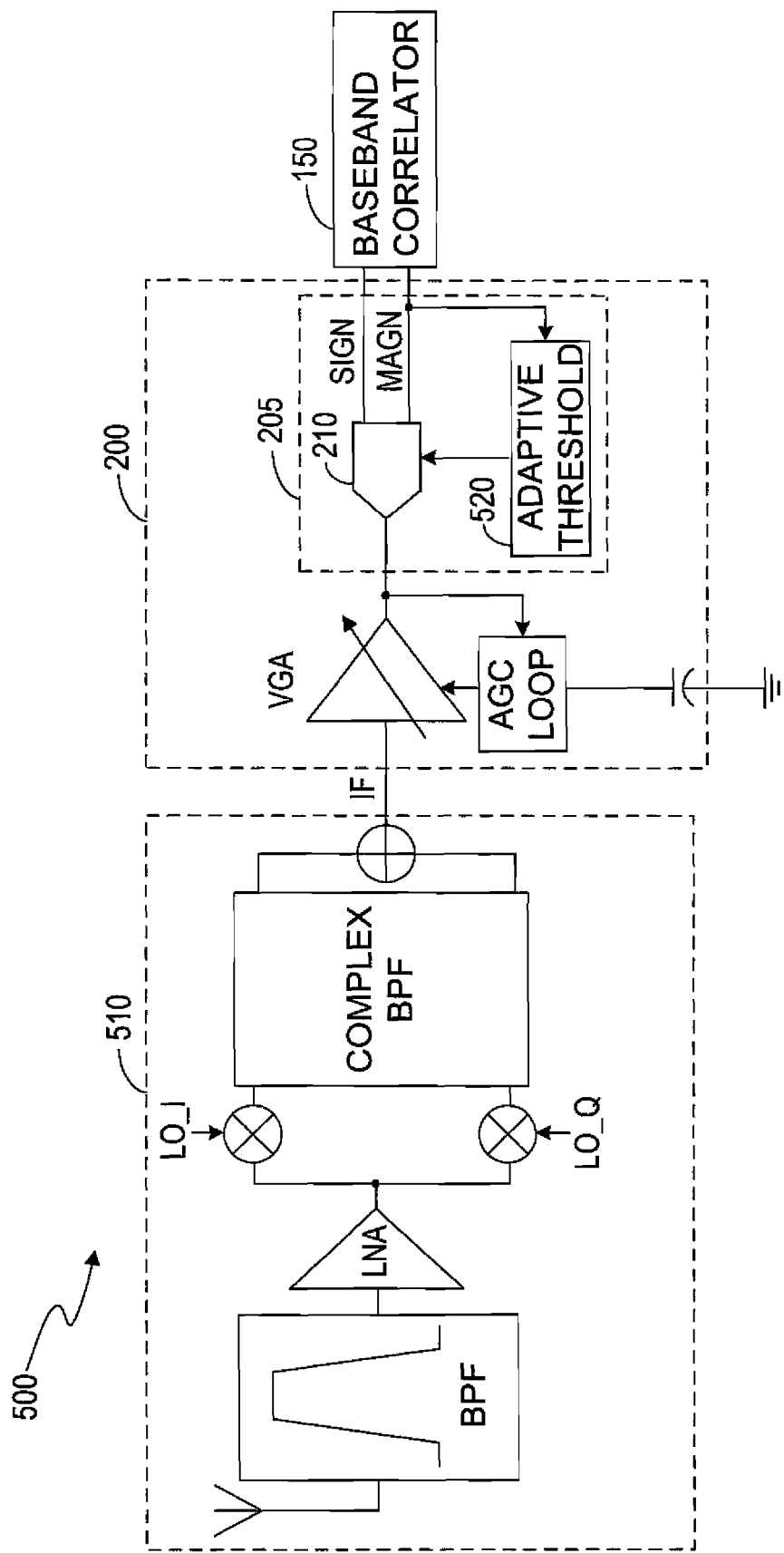
FIG. 13 is a block diagram of a GPS receiver according to one embodiment of the present invention.

FIG. 13 illustrates a block diagram of a GPS receiver 500. The GPS receiver 500 includes a circuit 510, the signal amplification and digitization circuit 200 and the baseband correlator 150. The circuit 510 is used for down-converting a RF signal to an IF signal after the RF signal sequentially goes through band pass filtering, low noise amplifying and mixing with a local carrier signal. The IF signal is supplied to the signal amplification and digitization circuit 200 that features the ADC 205 with adaptive threshold. As previously illustrated, the ADC 205 includes the comparator circuit 210 and an adaptive threshold loop 520 that is composed of the counter 220, the integrator 230, and the threshold generator 240. The signal amplification and digitization circuit 200 provides 2-bit digital signals MAGN and SIGN to the baseband correlator 150 for the correlation process.

Figure 14:
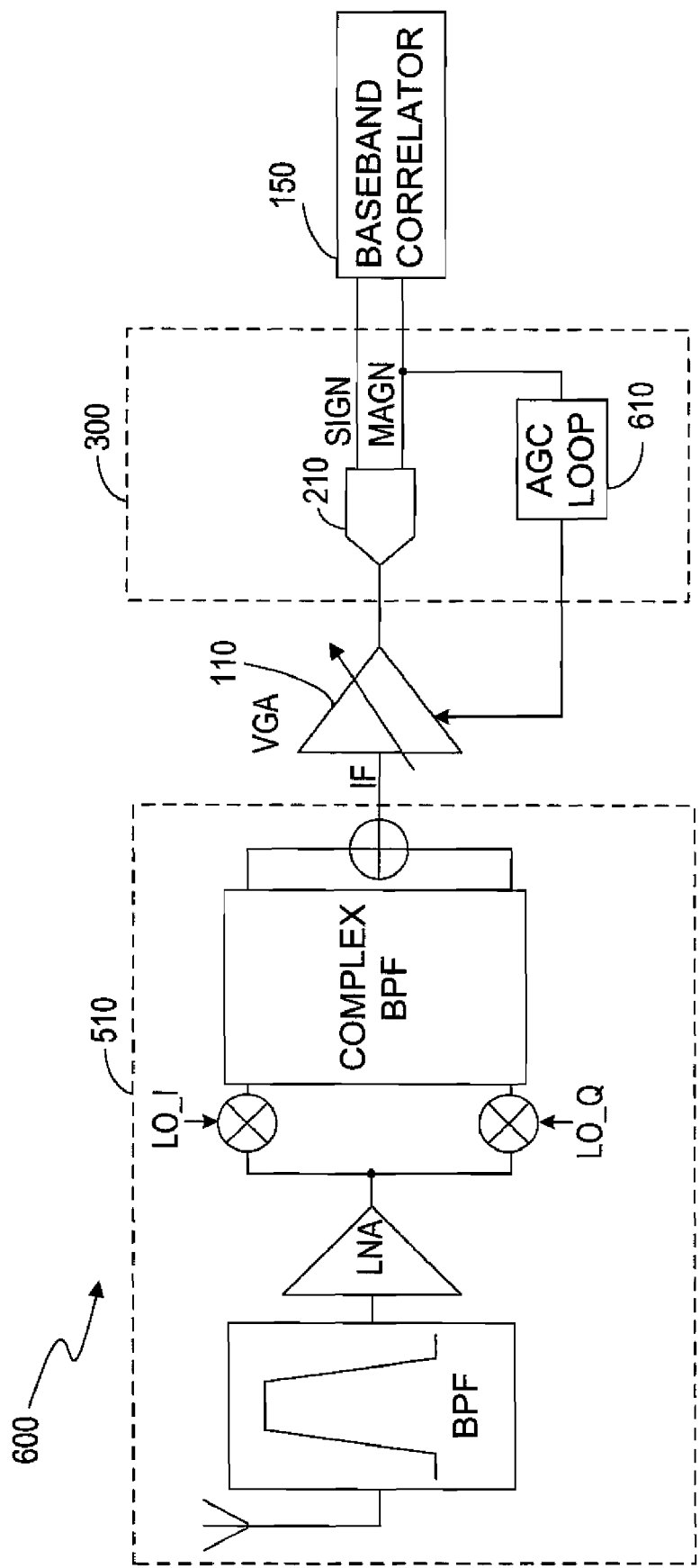
FIG. 14 is a block diagram of a GPS receiver according to another embodiment of the present invention.

FIG. 14 illustrates a block diagram of a GPS receiver 600. In the GPS receiver 600, the ADC 300 is utilized. As previously illustrated, the ADC 300 includes the comparator circuit 210 and an AGC loop 610 for regulating the gain of the VGA 110. The AGC loop 610 is composed of the counter 220 and the integrator 230.

In operation, the ADC 205 in FIG. 3 converts a signal from analog to digital and simultaneously rejects the CW interference mixed in the signal. The ADC includes the comparator circuit 210, the counter 220, the integrator 230, and the threshold generator 240. The comparator circuit 210 compares the signal with the positive threshold signal and the negative threshold signal provided by the threshold generator 240. Based on the comparison, the signal is converted to 2-bit digital signals MAGN and SIGN. The counter 220 counts the percentage of the digital magnitude signal MAGN at logic 1 to generate the bit signal based on the counted percentage. Then in response to the bit signal, the control signal is generated by the integrator 230 and the control signal is supplied to the threshold generator 240 and used for regulating the positive threshold signal and the negative threshold signal. Through consecutive regulation, the counted percentage is eventually maintained at the predetermined percentage threshold, fox example 33%, and so that the CW interference mixed in the signal is effectively rejected by the ADC 205.

Alternatively, the control signal from the integrator 230 can also be used to adjust the gain of the VGA 110 that is placed before the ADC 300 as shown in FIG. 11, while the positive and negative threshold signals are maintained constant instead. In this way, the CW interface mixed in the signal is also rejected effectively, and meanwhile, the AGC loop is formed through connecting the ADC 300 directly to the VGA 110.

Furthermore, the AGC circuit 400 can be realized in a digital form as shown in FIG. 12. In this situation, the AGC circuit 400 can be used in conventional communication systems that utilize frequency or phase modulation.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A receiver for acquiring a radio frequency (RF) signal, comprising:
   an analog to digital converter (ADC) for digitalizing an intermediate frequency (IF) signal based upon said RF signal to a digital magnitude signal having a first and second state and generating a control signal based upon a counted percentage of said digital magnitude signal of being said first state.

2. The receiver of claim 1, wherein said ADC further comprising:
   a counter for counting said digital magnitude signal within a predetermined period, generating an accumulation signal, and generating said counted percentage based upon a comparison between said accumulation signal with a percentage threshold signal.

3. The receiver of claim 2, wherein said counter further comprising:
   an accumulator for counting said digital magnitude signal and providing said accumulation signal;
   a comparator for comparing said accumulation signal with said percentage threshold signal; and
   a flip-flop for sampling said comparison signal.

4. The receiver of claim 2, wherein said ADC further comprising:
   an integrator coupled to said counter, said integrator generating said control signal in response to said counted percentage and regulating threshold signals at input terminals of said ADC.

5. The receiver of claim 4, wherein said integrator further comprising:
   a switch controller for receiving a signal indicative of the counted percentage;
   a first switch for receiving a positive reference signal under control of said switch controller;
   a second switch for receiving a negative reference signal under control of said switch controller; and
   a discrete-time integrator for generating said control signal based upon said positive and negative reference signals.

6. The receiver of claim 1, further comprising:
   a variable gain amplifier (VGA) coupled to said ADC, a gain of said VGA being regulated by said control signal and said VGA amplifying said IF signal according to said gain.

7. The receiver of claim 6, further comprising:
   an automatic gain control (AGC) circuit for controlling said gain of said VGA.

8. The receiver of claim 1, wherein said ADC has differential input signals.

9. A receiver for acquiring a radio frequency (RF) signal, comprising:
   an automatic gain control (AGC) circuit for implementing an automatic gain control in a digital form based upon said RF signal and generating a control signal based upon a counted percentage of a digital magnitude signal of being a state.

10. The receiver of claim 9, wherein said AGC circuit further comprising:
    a counter for counting said digital magnitude signal within a predetermined period, generating an accumulation signal, and generating said counted percentage based upon a comparison between said accumulation signal with a percentage threshold signal.

11. The receiver of claim 10, wherein said counter further comprising:
    an accumulator for counting said digital magnitude signal and providing said accumulation signal;
    a comparator for comparing said accumulation signal with said percentage threshold signal; and
    a flip-flop for sampling said comparison signal.

12. The receiver of claim 10, wherein said AGC circuit further comprising:
    an integrator coupled to said counter, said integrator generating said control signal in response to said counted percentage.

13. The receiver of claim 4, wherein said integrator further comprising:
a switch controller for receiving a signal indicative of the counted percentage;
a first switch for receiving a positive reference signal under control of said switch controller;
a second switch for receiving a negative reference signal under control of said switch controller; and
a discrete-time integrator for generating said control signal based upon said positive and negative reference signals.

14. The receiver of claim 9, further comprising:
a variable gain amplifier (VGA) coupled to said AGC circuit, a gain of said VGA being regulated by said control signal and said VGA amplifying an intermediate frequency (IF) signal according to said gain.

15. The receiver of claim 14, further comprising:
an analog to digital converter (ADC) for converting said amplified IF signal to a digital signal.

16. The receiver of claim 9, wherein said AGC circuit has differential input signals.

17. A method for processing a radio frequency (RF) signal buried in interferences, comprising:
converting the RF signal to an intermediate frequency (IF) signal;
amplifying the IF signal according to a predetermined gain of a variable gain amplifier (VGA);
digitalizing said amplified IF signal to a digital magnitude signal having a first and second state;
generating a control signal based upon a counted percentage of said digital magnitude signal of being said first state; and
rejecting said interferences in said IF signal according to said control signal.

18. The method of claim 17, wherein digitalizing said IF signal further comprising:
comparing said IF signal with a first and second threshold signals;
converting said IF signal to said digital magnitude signal;
counting a percentage of said digital magnitude signal at said first state;
generating a bit signal based on said counted percentage and a percentage threshold; and
generating said control signal based upon said bit signal.

19. The method of claim 18, further comprising:
adjusting said first and second threshold signals under control of said control signal.

20. The method of claim 18, further comprising:
regulating said predetermined gain of said VGA under control of said control signal.

* * * * *